(12) United States Patent
Shim et al.

(10) Patent No.: US 6,181,623 B1
(45) Date of Patent: Jan. 30, 2001

(54) SEMICONDUCTOR MOS/BIPOLAR COMPOSITE TRANSISTOR AND SEMICONDUCTOR MEMORY DEVICE USING THE SAME

(75) Inventors: Young-Bo Shim; Yung-Jin Gang, both of Ichon-shi (KR)

(73) Assignee: Hyundai Electronics Industries Co., Ltd., Ichon-shi (KR)

( * ) Notice: Under 35 U.S.C. 154(b), the term of this patent shall be extended for 0 days.

(21) Appl. No.: 09/472,984

(22) Filed: Dec. 28, 1999

(30) Foreign Application Priority Data

Dec. 30, 1998 (KR) .................................................. 98-61151

(51) Int. Cl.⁷ ...................................................... G11C 7/02
(52) U.S. Cl. .............................................................. 365/208
(58) Field of Search ..................................... 365/205, 207, 365/208

(56) References Cited

U.S. PATENT DOCUMENTS

| 4,654,831 | 3/1987 | Venkatesh | 365/207 |
| 5,247,479 | 9/1993 | Young | 365/189.05 |
| 5,301,158 | 4/1994 | Yokomizo | 365/205 |
| 5,371,703 | 12/1994 | Miyamoto | 365/185 |
| 5,412,607 | 5/1995 | Kusaba | 365/208 |
| 5,815,452 | 9/1998 | Shen | 365/207 |
| 5,856,949 | 6/1999 | Jiang | 365/203 |
| 5,889,699 | 3/1999 | Takano | 365/185.18 |
| 6,049,496 | * 4/2000 | Forbes et al. | 365/208 |

FOREIGN PATENT DOCUMENTS

| 4-89691 | 3/1992 | (JP) | 11/409 |
| 10-106282 | 4/1998 | (JP) . | |

* cited by examiner

*Primary Examiner*—Trong Phan
(74) *Attorney, Agent, or Firm*—Jacobson, Price, Holman & Stern, PLLC

(57) ABSTRACT

In semiconductor memory device including a sense amplifier, the sense amplifier includes a bit line and a bit line bar coupled to the memory cell, a data line and an inverting data lines for transferring an output of the sense amplifier, a first P-type MOS/BIPOLAR composite transistor having a source/emitter coupled to a first level potential, a gate/base coupled to the inverting data line and a drain/collector coupled to the data line, a second P-type MOS/BIPOLAR composite transistor having a source/emitter coupled to the first level potential, a gate/base coupled to the data line and a drain/collector coupled to the inverting data line, a first N-type MOS/BIPOLAR composite transistor having a drain/collector coupled to the data line and a gate/base coupled to the inverting data line, a second N-type MOS/BIPOLAR composite transistor having a drain/collector coupled to the inverting data line and a gate/base coupled to the data line, a first load coupled between a source/emitter of the first N-type MOS/BIPOLAR composite transistor and a second level potential, and a second load coupled between a source/emitter of the second N-type MOS/BIPOLAR composite transistor and the second level potential.

22 Claims, 8 Drawing Sheets

SEMICONDUCTOR MOS/BIPOLAR COMPOSITE TRANSISTOR AND SEMICONDUCTOR MEMORY DEVICE USING THE SAME

FIELD OF THE INVENTION

The present invention relates to a semiconductor device; and, more particularly, to a semiconductor MOS/BIPOLAR composite transistor operating at a high speed and a semiconductor memory device using the same.

DESCRIPTION OF THE PRIOR ART

FIG. 1 shows a circuit diagram of a conventional voltage-sensing amplifier. FIG. 2 is a waveform showing an operation characteristic of a conventional voltage-sensing amplifier. As is well known to those skilled in the art, the voltage-sensing amplifier senses a small voltage difference between bit line BL and bit line bar /BL and converts the difference into a full-swing digital signal. As shown in FIG. 1, the conventional voltage-sensing amplifier includes PMOS (P-type metal oxide semiconductor) transistors P0 and P1 and N-type MOS (metal oxide semiconductor) transistors N0 and N1. As can be seen, the voltage-sensing amplifier is incorporated with latch circuits having a positive feedback configuration using CMOS (complementary metal oxide semiconductor) inverters.

An operation of the voltage-sensing amplifier will be described with reference to FIGS. 1 and 2.

First, a precharge signal PRE is set to a high level and the N-type MOS transistor N2 is turned on, resulting in equalizing a first output VO+ and a second output VO− to a predetermined level. The predetermined level is determined by device parameters of the PMOS transistors P0 and P1 and NMOS transistors N0 and N1 such as a channel length, a channel width and the like, and is typically about half the supply potential (0.5 Vdd). Next, a level of a word line rises up to a predetermined level corresponding to a sum of a supply potential (Vdd) and a threshold voltage (Vt) and a cell transistor is selectively turned on, so that a corresponding memory cell is accessed. Then, a voltage signal corresponding to data of the selected memory cell is transferred to a bit line BL and a bit line bar /BL from the selected memory cell. At the same time, the precharge signal PRE is set to a low level and the sense amplifier starts to operate. Here, the power potential (Vdd) is applied to one terminal denoted by PLAT which is coupled to the PMOS transistors P0 and P1. A ground potential is applied to the other terminal denoted by NLAT which is coupled to the N-type MOS transistors N0 and N1.

Referring to FIG. 2 showing a waveform of respective signals when a high level data is sensed, a voltage signal of a sense amplifier is developed according to the data on the bit line BL and a bit line bar /BL, and then, the first output VO+ and the second output VO− are changing. As can be seen, a time delay of about 3.2 ns after the precharge signal PRE is set to a low level, the first output VO+ and the second output VO− are fully developed. Due to such a time delay, the operation speed of the memory device may be slow. That is, since the voltage-sensing amplifier depends on a capacitive load existing on the bit line BL and the bit line bar /BL, the time delay occurs until a line capacitor corresponding to the capacitive load are fully charged, wherein the line capacitor depends on an RC time constant. Therefore, there has been a problem that the sense amplifier operates slowly.

SUMMARY OF THE INVENTION

It is, therefore, an object of the present invention to provide a semiconductor MOS/BIPOLAR composite transistor operating at a high speed and a semiconductor memory device using the same.

In accordance with an embodiment of the present invention, there is provided a MOS/BIPOLAR composite transistor having a horizontal parasitic bipolar junction transistor connected in parallel to a MOS transistor, comprising: a semiconductor substrate of a first conductivity type; two active regions of a second conductivity type formed in the semiconductor substrate, wherein the two active regions are space from each other at a predetermined interval; a gate insulating layer formed on the semiconductor substrate between the two active regions; and a gate electrode formed on the gate insulating layer, wherein the gate electrode is electrically connected to the semiconductor substrate, whereby a channel of the first conductivity type is formed between the two active regions beneath the gate insulating layer to form a MOS transistor and simultaneously, the horizontal parasitic bipolar junction transistor is formed by the semiconductor substrate of the first conductivity type and the two active regions of the second conductivity type.

In accordance with another embodiment of the present invention, there is provided a semiconductor memory device including a memory cell array with a plurality of memory cells and a sense amplifier which detects and amplifies a data signal from the memory cell array to output a full swing signal, the sense amplifier comprising: a bit line and a bit line bar coupled to the memory cell; a data line and an inverting data lines for transferring an output of the sense amplifier; a first P-type MOS/BIPOLAR composite transistor having a source/emitter coupled to a first level potential, a gate/base coupled to the inverting data line and a drain/collector coupled to the data line; a second P-type MOS/BIPOLAR composite transistor having a source/emitter coupled to the first level potential, a gate/base coupled to the data line and a drain/collector coupled to the inverting data line; a first N-type MOS/BIPOLAR composite transistor having a drain/collector coupled to the data line and a gate/base coupled to the inverting data line; a second N-type MOS/BIPOLAR composite transistor having a drain/collector coupled to the inverting data line and a gate/base coupled to the data line; a first load coupled between a source/emitter of the first N-type MOS/BIPOLAR composite transistor and a second level potential; and a second load coupled between a source/emitter of the second N-type MOS/BIPOLAR composite transistor and the second level potential.

In accordance with further another embodiment of the present invention, there is provided a semiconductor memory device including a memory cell array with a plurality of memory cells and a sense amplifier which detects and amplifies a data signal from the memory cell array to output a full swing signal, the sense amplifier comprising: a bit line and a bit line bar coupled to the memory cell; a data line and an inverting data line to which input/output data are applied; a first P-type MOS/BIPOLAR composite transistor having a source/emitter coupled to a first level potential, a gate/base coupled to a second output node and a drain/collector coupled to a first output node; a second P-type MOS/BIPOLAR composite transistor having a source/emitter coupled to the first level potential, a gate/base coupled to the first output node and a drain/collector coupled to the second output node; a first N-type MOS/BIPOLAR composite transistor having a drain/collector coupled to the first output node and a gate/base coupled to the second output node; a second N-type MOS/BIPOLAR composite transistor having a drain/collector coupled to the second output node and a gate/base coupled to the first output node; a first load coupled between a source/emitter of the first N-type MOS/BIPOLAR composite transistor and a second level potential; a second load coupled between a source/emitter of the second N-type MOS/BIPOLAR composite transistor and the second level potential; a first select MOS/BIPOLAR composite transistor coupled between the bit line and a source/emitter of the first N-type MOS/BIPOLAR composite transistor, wherein the first select transistor is turned on in response to a sense enable signal; a second select MOS/BIPOLAR composite transistor coupled between the bit line bar and the source/emitter of the second N-TYPE MOS/BIPOLAR composite transistor, wherein the second select transistor is turned on in response to the sense enable signal; a first column-select MOS/BIPOLAR composite transistor coupled between the first output node and the data line; and a second column-select transistor coupled between the second output node and the inverting data line.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 1:
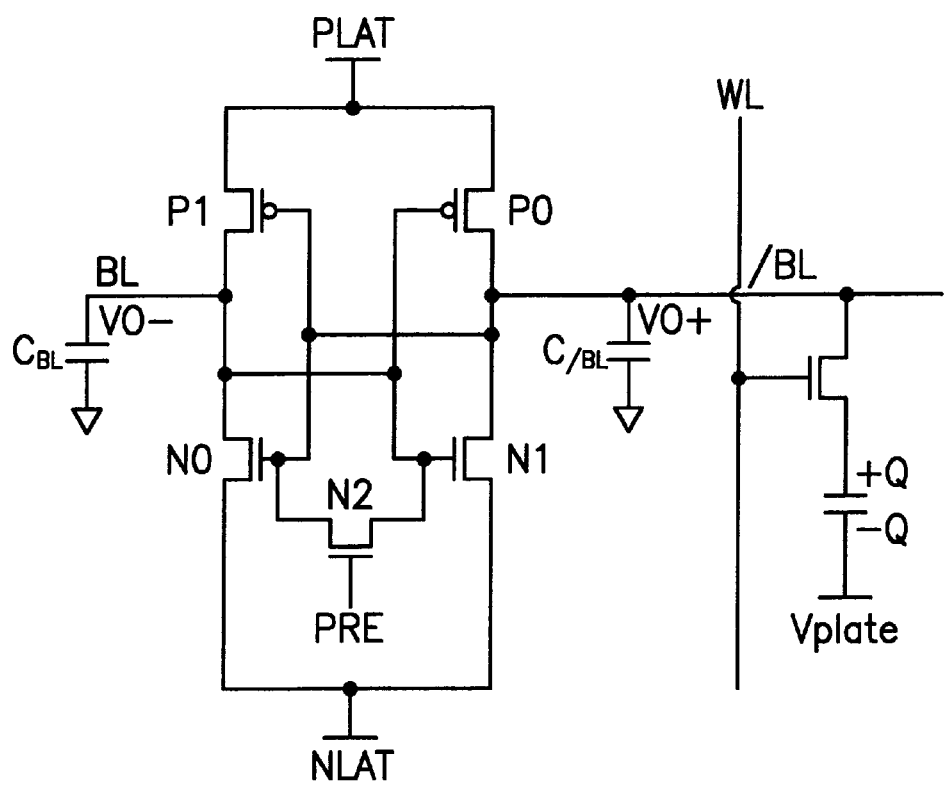
FIG. 1 is a circuit diagram of a conventional voltage-sensing amplifier.
Figure 2:
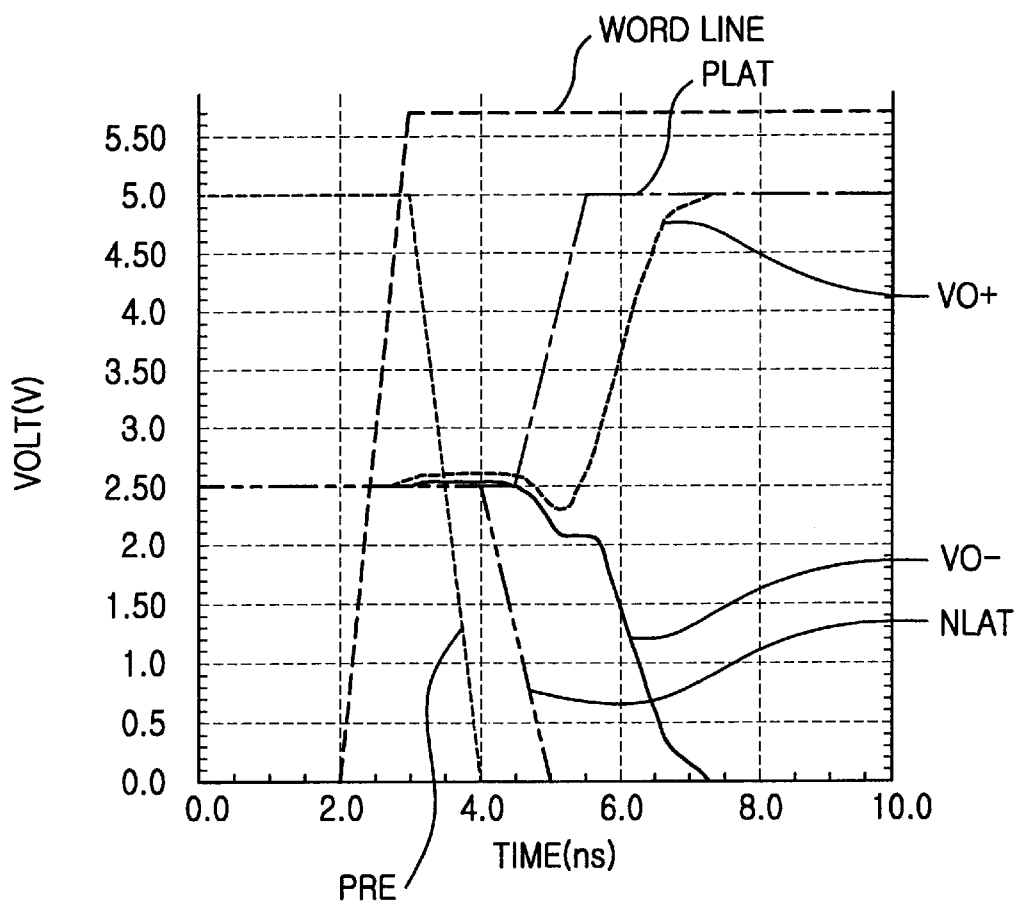
FIG. 2 is a waveform of respective signals of a voltage-sensing amplifier shown in FIG. 1.
Figure 3:
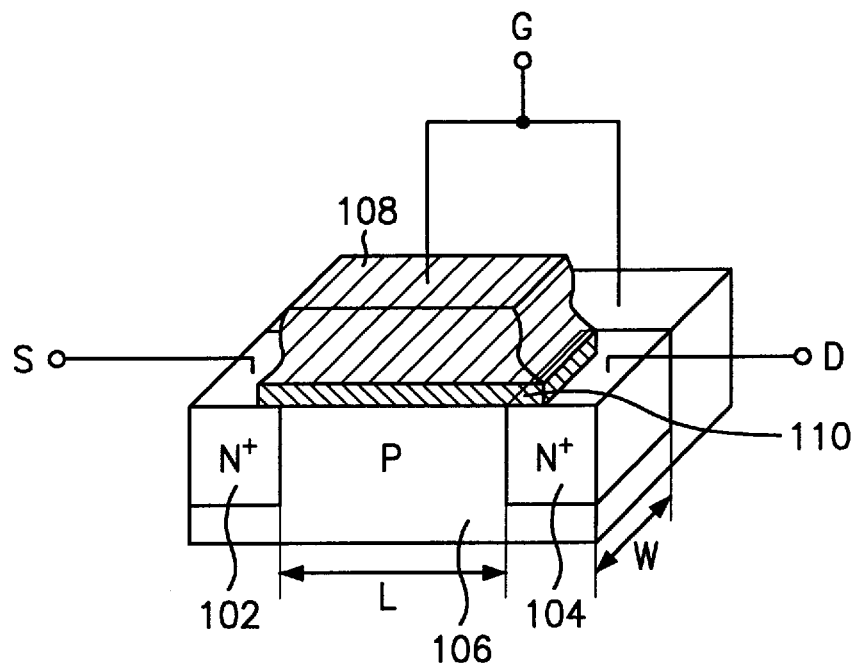
FIG. 3 is a perspective diagram of a semiconductor N-type MOS/BIPOLAR composite transistor according to an embodiment of the present invention.

FIG. 3 shows a perspective view of a semiconductor N-type MOS/BIPOLAR composite transistor according to the present invention. As shown in FIG. 3, the semiconductor N-type MOS/BIPOLAR composite transistor according to the present invention includes $N^+$ active regions 102 and 104 formed in a P-type semiconductor substrate 106 and spaced from each other at a predetermined interval, a gate insulating layer 110 formed on the P-type semiconductor substrate 106, and a gate electrode 108 formed on the gate insulating layer 110. In such a structure, an N-type channel is formed between the $N^+$ active regions 102 and 104 beneath the gate insulating layer 110. In addition, the gate electrode 108 is connected to the P-type substrate 106. A reference numeral L indicates a channel length and a reference numeral W indicates a channel width. As a result, $N^+$/P-sub/$N^+$ structure results in a horizontal parasitic bipolar junction transistor (BJT) as well as an N-type MOS transistor. At this time, the horizontal parasitic bipolar junction transistor can be used as an input of a sense amplifier of a current-sensing type. Such a structure having the horizontal bipolar junction transistor connected in parallel to the N-type MOS transistor has an advantage that it does not need an additional area in order to form the bipolar junction transistor. Hereinafter, such a structure shown in FIG. 3 is referred to as an N-type MOS/BIPOLAR composite transistor. In FIG. 3, a reference numeral G represents a gate/base terminal, S a source/emitter terminal and D a drain/collector terminal, respectively.

Figure 5:
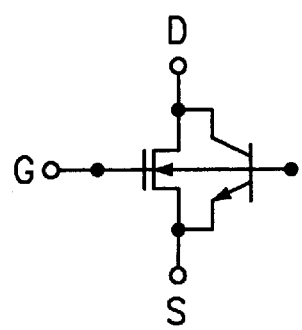
FIG. 5 is a circuit symbol for a semiconductor N-type MOS/BIPOLAR composite transistor shown in FIG. 3.
Figure 4:
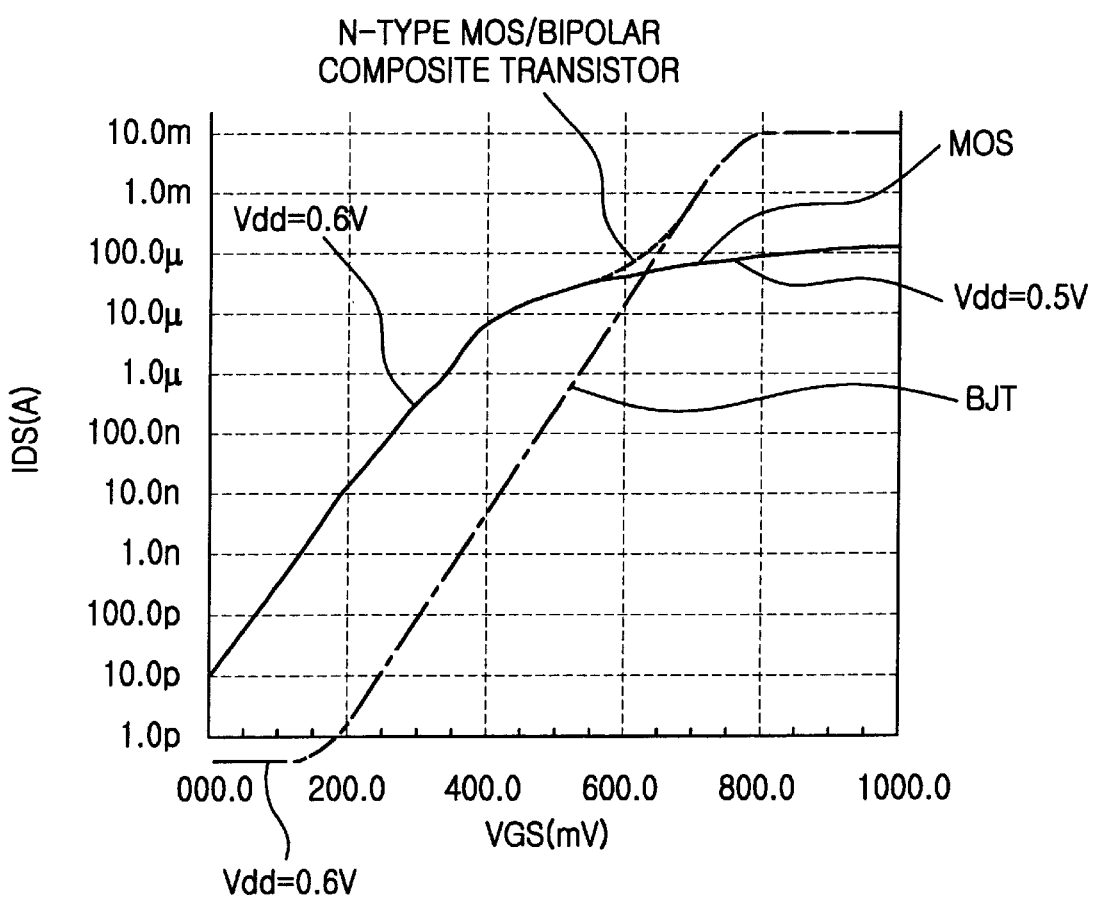
FIG. 4 is a graph showing an input/output characteristic of a semiconductor N-type MOS/BIPOLAR composite transistor shown in FIG. 3.

FIG. 4 is a graph of an output current versus an input voltage for the N-type MOS/BIPOLAR composite transistor. The input voltage VGS is a gate-to-source voltage and the output current IDS is a drain-to-source current. As can be seen, when the input voltage VGS reaches to above 0.6V, the horizontal parasitic bipolar junction transistor starts to operate. Due to a current caused by the horizontal parasitic bipolar junction transistor, a total current of the N-type MOS/BIPOLAR composite transistor is increased. Therefore, even if a capacitive component of devices coupled to the N-type MOS/BIPOLAR composite transistor is large, it can be fast charged. FIG. 5 shows a circuit symbol for the N-type MOS/BIPOLAR composite transistor.

Figure 6:
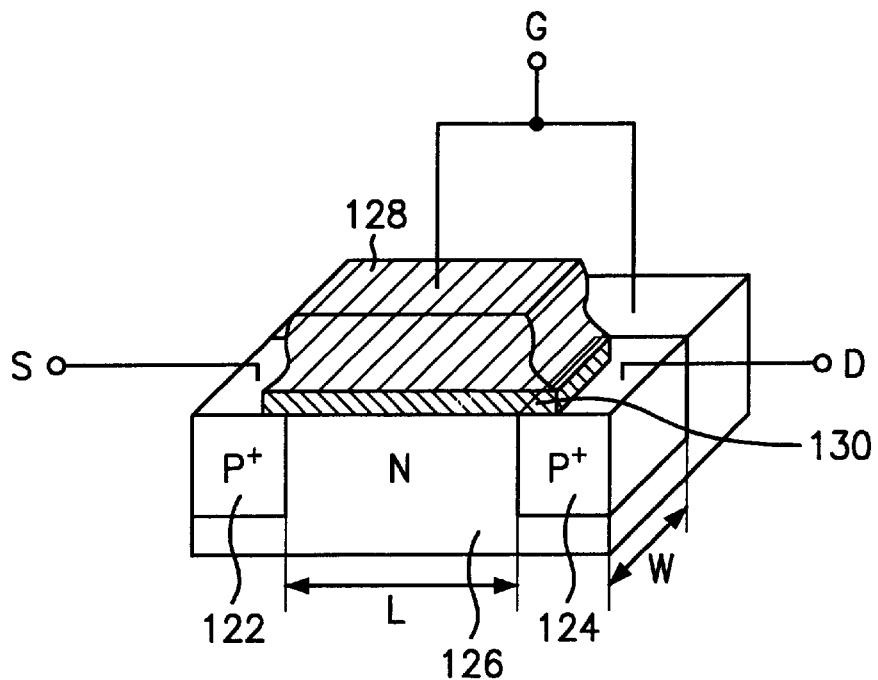
FIG. 6 is a perspective diagram of a semiconductor P-type MOS/BIPOLAR composite transistor according to another embodiment of the present invention.
Figure 7:
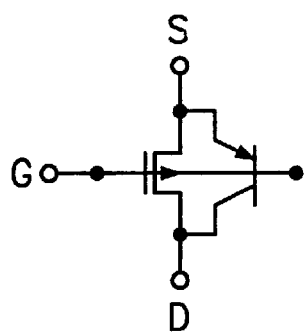
FIG. 7 is a circuit symbol for a semiconductor P-type MOS/BIPOLAR composite transistor shown in FIG. 6.

FIG. 6 shows a perspective view of a semiconductor P-type MOS/BIPOLAR composite transistor according to the present invention. As shown in FIG. 6, the semiconductor transistor according to the present invention includes $P^+$ active regions 122 and 124 formed on an N-type semiconductor substrate 126, a gate insulating layer 130 formed on the N-type semiconductor substrate 126, and a gate electrode 128 formed on the gate insulating layer 130. In such a structure, a P-type channel is formed between the $P^+$ active regions 122 and 124 beneath the gate insulating layer 130. In addition, the gate electrode 128 is connected to the N-type semiconductor substrate 126. A reference numeral L indicates a channel length and a reference numeral W indicates a channel width. As a result, $P^+$/N-sub/$P^+$ structure results in a horizontal parasitic bipolar junction transistor (BJT) as well as a P-type MOS transistor. At this time, the horizontal parasitic bipolar junction transistor can be used as an input of a sense amplifier of a current-sensing type. Hereinafter, such a structure shown in FIG. 6 is referred to as a P-type MOS/BIPOLAR composite transistor. In FIG. 6, a reference numeral G represents a gate/base terminal, S a source/emitter terminal and D a drain/collector terminal, respectively. FIG. 7 shows a circuit symbol for the P-type MOS/BIPOLAR composite transistor.

Figure 8:
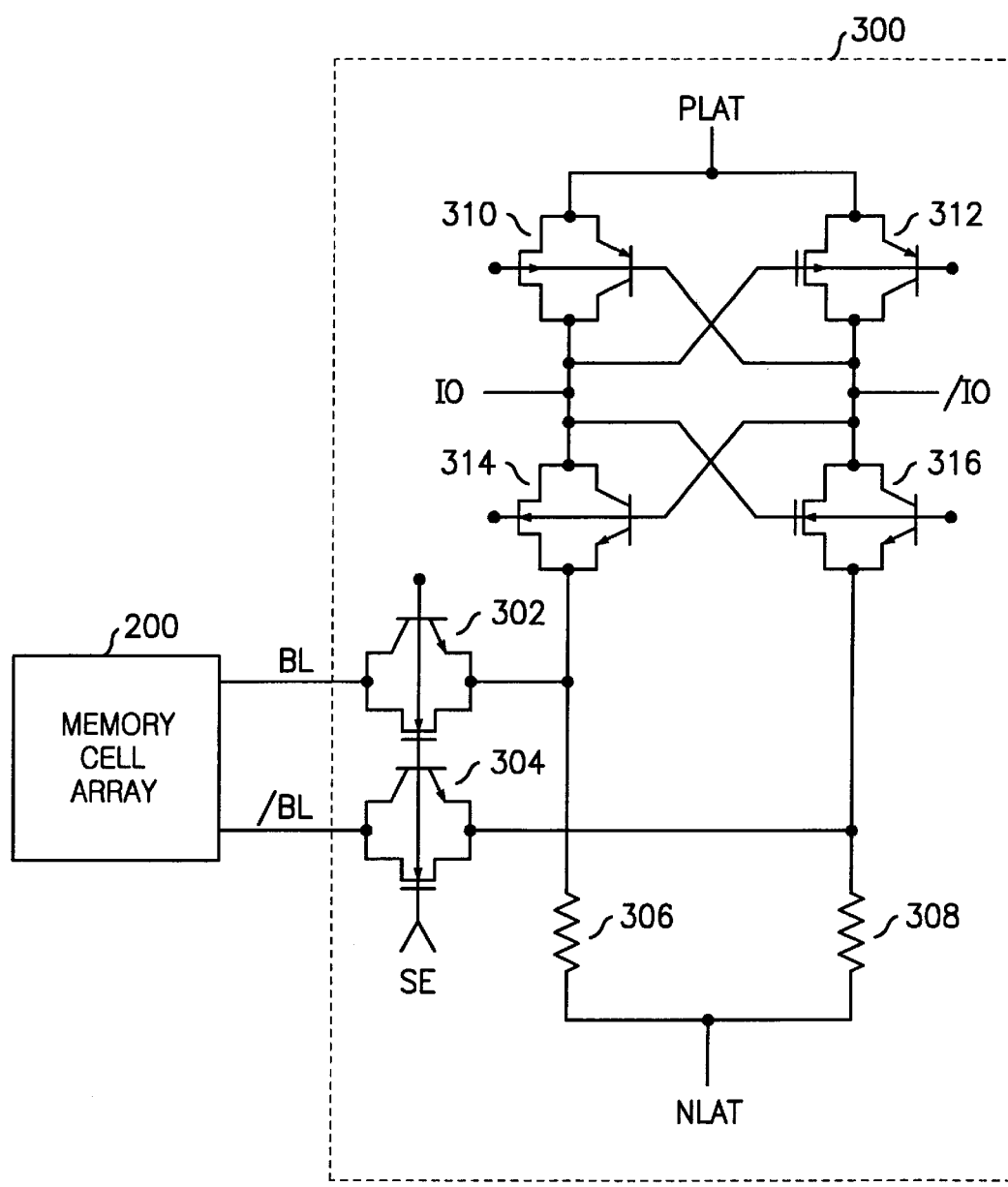
FIG. 8 is a circuit diagram illustrating a current-sensing amplifier using a semiconductor MOS/BIPOLAR composite transistor according to an embodiment of the present invention.

FIG. 8 shows a sense amplifier using the MOS/BIPOLAR composite transistors according to the present invention.

Referring to FIG. 8, a bit line BL and a bit line bar /BL are coupled to a memory cell array 200. A P-type MOS/BIPOLAR composite transistor 310 has a source/emitter coupled to a first terminal denoted by PLAT, a gate/base coupled to an inverting data line /IO and a drain/collector coupled to a data line IO, and a P-type MOS/BIPOLAR composite transistor 312 has a source/emitter coupled to the first terminal PLAT, a gate/base coupled to the data line IO and a drain/collector coupled to the inverting the data line /IO. An N-type MOS/BIPOLAR composite transistor 314 has a drain/collector coupled to the data line IO and a gate/base coupled to the inverting data line /IO, and an N-type MOS/BIPOLAR composite transistor 316 has a drain/collector coupled to the inverting data line /IO and a gate/base coupled to the data line IO. A load 306 is coupled between a source/emitter of the N-type MOS/BIPOLAR composite transistor 314 and a second terminal NLAT, and a load 308 is coupled between a source/emitter of the N-type MOS/BIPOLAR composite transistor 316 and the second terminal NALT. A select N-type MOS/BIPOLAR composite transistor 302 is coupled between the bit line BL and the source/emitter of the N-type MOS/BIPOLAR composite transistor 314, whose gate/base receives a sense enable signal SE, and a select N-type MOS/BIPOLAR composite transistor 304 is coupled between the bit line bar /BL and the source/emitter of the N-type MOS/BIPOLAR composite transistor 316, whose gate/base receives the sense enable signal SE. Here, an output of the sense amplifier is transferred through an data line IO and an inverting data line /IO transfer to an external circuit.

An operation of the sense amplifier according to the present invention will be described with reference to FIG. 8.

When the sense enable signal SE becomes a high level, the select N-type MOS/BIPOLAR composite transistors 302 and 304 are turned on and the sense amplifier 300 is electrically connected to the bit line BL and the bit line bar /BL. Typically, a supply potential (Vdd) is applied to the first terminal denoted by PLAT and a ground potential is applied to the second terminal denoted by NLAT.

First, in case where a voltage on the bit line BL is greater than a voltage on the bit line bar /BL, the N-type MOS/BIPOLAR composite transistor 316 is turned on, and then the N-type MOS/BIPOLAR composite transistor 314 is turned off, so that a level of the inverting data line /IO is lower than that of the data line IO. Therefore, the P-type MOS/BIPOLAR composite transistor 310 is turned on and then the P-type MOS/BIPOLAR composite transistor 312 is turned off, so that a level of the data line IO becomes higher than that of the inverting data line /IO. Eventually, the voltage difference between the data line IO and the inverting data line /IO is increased. As a result, a level of the data line IO goes up to the supply potential (Vdd) and a level of the inverting data line /IO goes down the ground potential (Vss).

On the contrary, in case where a voltage on the bit line bar /BL is greater than a voltage on the bit line BL, a level of the inverting data line /IO becomes higher than that of the data line IO.

As mentioned above, since the sense amplifier 300 using the MOS/BIPOLAR composite transistors can supply a current flow faster than the voltage-sensing amplifier which only uses a conventional MOS transistor, there is an advantage that it can greatly reduce the time period to be taken to sense and amplify the voltage difference between the bit line BL and the bit line bar /BL.

Meanwhile, the select N-type MOS/BIPOLAR composite transistors 302 and 304 can be preferably replaced with P-type MOS/BIPOLAR composite transistors by supplying a sense enable signal SE set to a low level. Additionally, when the select N-type MOS/BIPOLAR composite transistors 302 and 304 are turned off, the data line IO and the inverting data line /IO are set to a predetermined voltage level determined by the design scale of the N-type MOS/BIPOLAR composite transistors 314 and 316 and the P-type MOS/BIPOLAR composite transistors 310 and 312, where the predetermined voltage level is typically about half the supply potential (0.5 Vdd).

Figure 9:
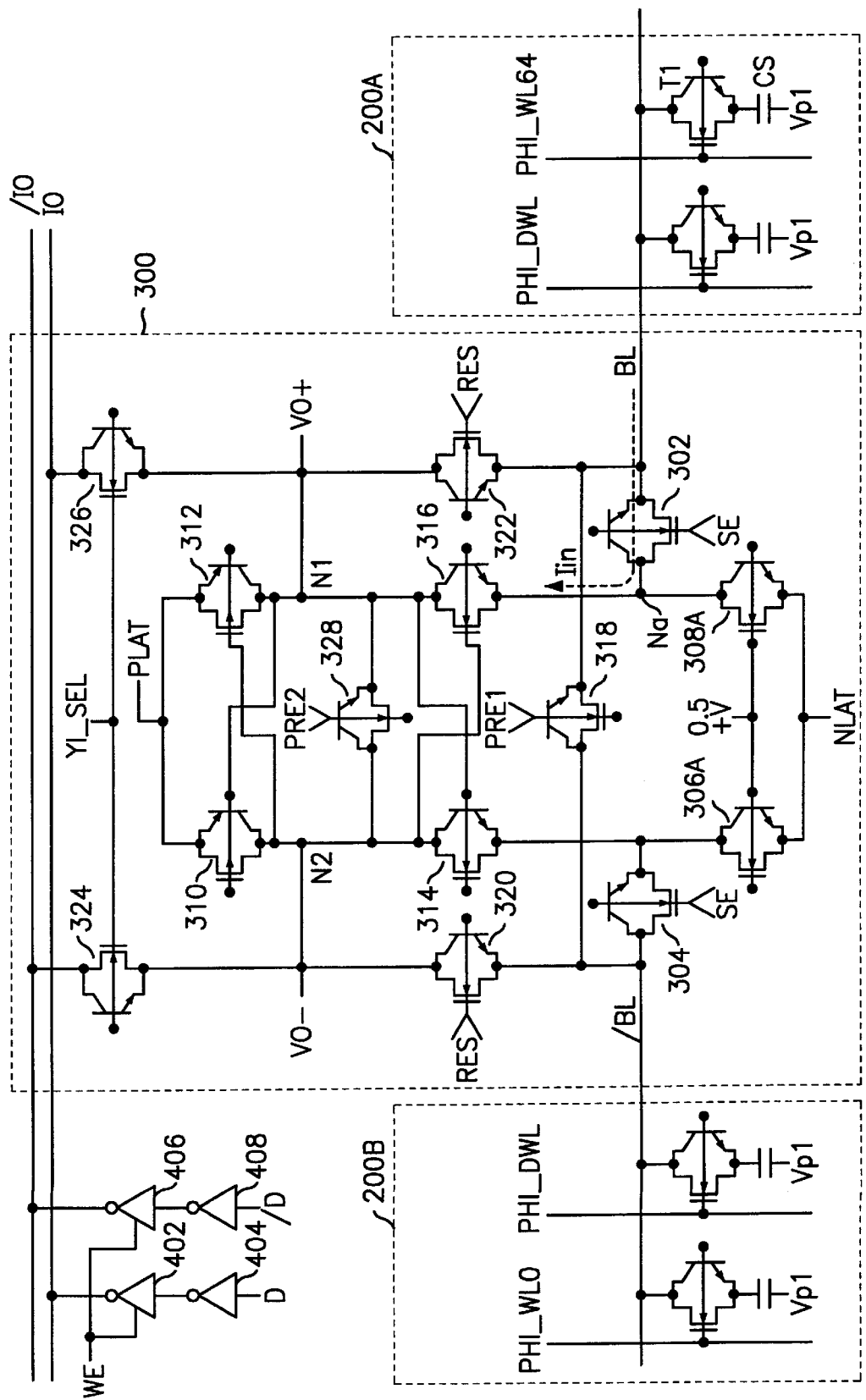
FIG. 9 is a circuit diagram illustrating a current-sensing amplifier using a semiconductor MOS/BIPOLAR composite transistor according to another embodiment of the present invention.

FIG. 9 is a circuit diagram illustrating a sense amplifier according to another embodiment of the present invention. For the sake of simplicity, the same reference numerals as FIG. 8 indicate the same elements as FIG. 8 and the explanation about the same elements is omitted.

Referring to FIG. 9, a bit line BL and a bit line bar /BL are coupled to the memory cells 200A and 200B, respectively. A P-type MOS/BIPOLAR composite transistor 312 has a source/emitter coupled to a first terminal denoted by PLAT, a gate/base coupled to a second output node $N_2$ and a drain/collector coupled to the first output node $N_1$, and a P-type MOS/BIPOLAR composite transistor 310 has a source/emitter coupled to the first terminal PLAT, a gate/base coupled to the first output node $N_1$ and a drain/collector coupled to the second output node $N_2$. An N-type MOS/BIPOLAR composite transistor 316 has a drain/collector coupled to the first output node $N_1$ and a gate/base coupled to the second output node $N_2$, an N-type MOS/BIPOLAR composite transistor 314 has a drain/collector coupled to the second output node $N_2$ and a gate/base coupled to the first output node $N_1$, a load 306A is coupled between a source/emitter of the N-type MOS/BIPOLAR composite transistor 314 and the second terminal denoted by NLAT, a load 308A is coupled to a source/emitter of the N-type MOS/BIPOLAR composite transistor 316. A select N-type MOS/BIPOLAR composite transistor 302 is coupled between the bit line BL and a source/emitter of the N-type MOS/BIPOLAR composite transistor 316, wherein the select N-type MOS/BIPOLAR composite transistor 302 is turned on when a sense enable signal SE is enabled. A select N-type MOS/BIPOLAR composite transistor 304 is coupled between the bit line bar /BL and the source/emitter of the N-type MOS/BIPOLAR composite transistor 314, wherein the select N-type MOS/BIPOLAR composite transistor 304 is turned on when the sense enable signal SE is enabled. A column-select N-type MOS/BIPOLAR composite transistor 326 is coupled between the first output node $N_1$ and the data line IO, and a column-select N-type MOS/BIPOLAR composite transistor 324 coupled between the second output node $N_2$ and the inverting data line /IO.

An operation of the sense amplifier will be described with reference to FIG. 9.

Referring to FIG. 9, the column-select N-type MOS/BIPOLAR composite transistors 324 and 326 are turned on when a column line select signal Y1_SEL is high, so that a first output VO+ and a second output VO– are transmitted to a data line I/O and an inverting data line /IO, respectively. An N-type MOS/BIPOLAR composite transistor 318 is turned on when a precharge signal PRE1 is set to a high level, so that a bit line BL and a bit line bar /BL are equalized. Furthermore, an N-type MOS/BIPOLAR composite transistor 328 is tuned on when a precharge signal PRE2 is set to a high level, so that the first output VO+ and the second output VO– are equalized, respectively. At this time, the precharge signals PRE1 and PRE2 can be simultaneously high. Also, after the precharge signal PRE1 is set to a high level, the precharge signal PRE2 can be set to a high level. Although the precharge signal PRE2 is used to make the first and second outputs VO+ and VO– and the bit line BL and the bit line bar /BL to the same voltage, it is desired that the precharge signals PRE1 and PRE2 be simultaneously high in order to achieve a fast precharging operation. In addition, in view of power consumption, it is desired that the precharge signal PRE2 be high after the precharge signal PRE1 is high. The N-type MOS/BIPOLAR composite transistors 306A and 308A, each of whose gates receives about 0.5V, i.e., low level, are kept on a turned-off state, so that they serve as resistors having a linear characteristic. When a control signal RES is set to a high level, the N-type MOS/BIPOLAR composite transistors 322 and 320 connect the bit line BL with the first output VO−, and the bit line bar /BL with the second output VO−, respectively. When the control signal RES is set to a low level, the N-type MOS/BIPOLAR composite transistors 322 and 320 isolate the bit line BL and the bit line bar /BL from the first and second output VO+ and VO−, respectively. At a write operation, the control signal RES is set to a high level in order to turn on the N-type MOS/BIPOLAR composite transistors 320 and 322. That is, after completing a sensing and amplifying operation, when the first output VO+ and the second output VO− are again written to the memory cells 200B and 200A, respectively, the control signal RES is set to a high level to thereby turn on the N-type MOS/BIPOLAR composite transistors 320 and 322.

Meanwhile, as shown in FIG. 9, it is preferable to implement the memory cells with the N-type or P-type MOS/BIPOLAR composite transistors according to the present invention. Although the DRAM cells 200A and 200B including one-transistor and one-capacitor is shown in FIG. 9, it is also applicable to other memory cells such as a SRAM. Reference numerals 200A and 200B indicate memory cell array, PHI_WL0, PHI_DWL, PHI_WL64 indicate word lines, and Vp1 indicates a plate voltage. The read/write operation of the memory cell is performed by a conventional method. Inverters 402 and 404 and inverters 406 and 408 are used as buffers for receiving data and inverting data in response to a write enable signal WE, respectively.

For example, when a voltage Vp1 of about 5V is applied to a capacitor CS, the N-type MOS/BIPOLAR composite transistor 302 is turned on and a charge current Iin flows to a source of the N-type MOS/BIPOLAR composite transistor 316. At this time, it is desired that an impedance corresponding to the N-type MOS/BIPOLAR composite transistor 316 at a node Na be much smaller than that corresponding to the N-type MOS/BIPOLAR composite transistor 308A. Therefore, the CMOS latch circuits including the P-type MOS/BIPOLAR composite transistors 310 and 312 and the N-type MOS/BIPOLAR composite transistors 314 and 316 are triggered due to the charge current Iin, so that the current-sensing amplifier starts to operate.

Figure 10:
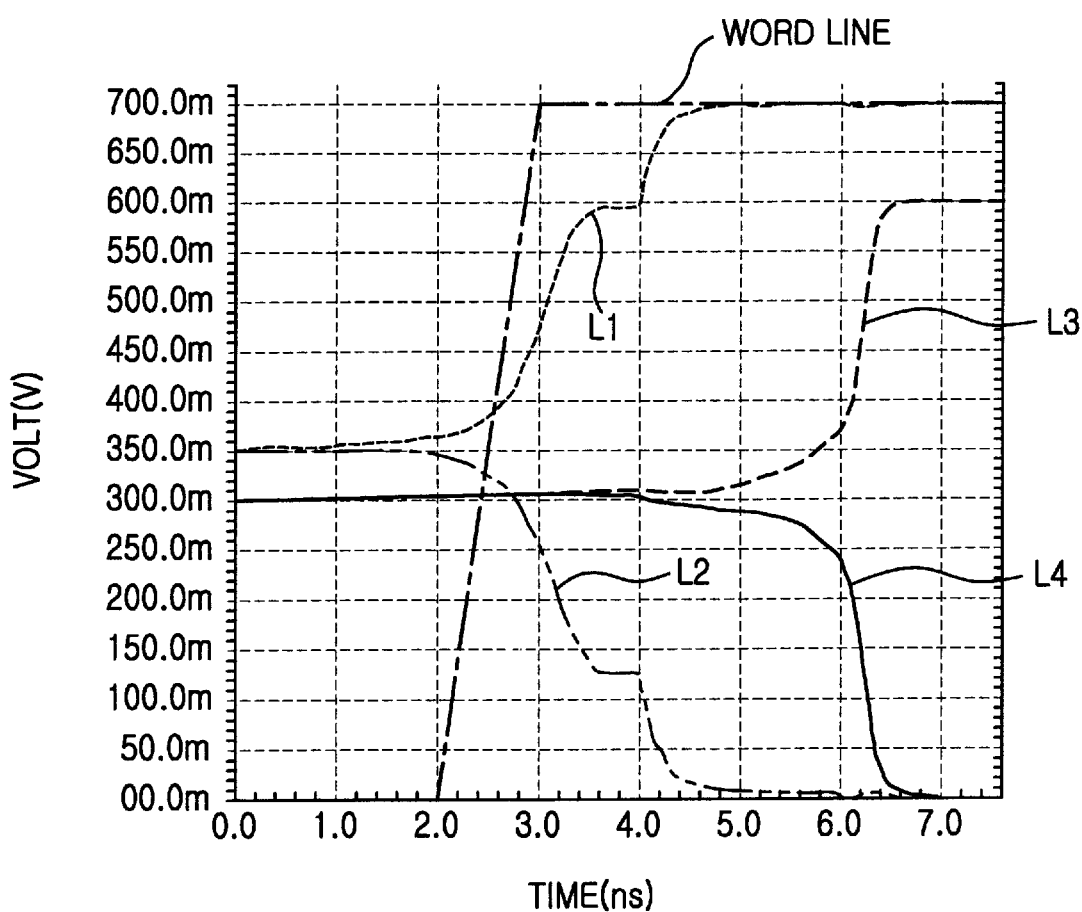
FIG. 10 is a graph showing a characteristic of a current-sensing amplifier using a semiconductor MOS/BIPOLAR composite transistor.

FIG. 10 is a graph showing a characteristic of a sense amplifier shown in FIG. 9. Reference numerals L1 and L2 indicate the outputs of the sense amplifier according to the present invention, and reference numerals L3 and L4 indicate the outputs of the sense amplifier according to the prior art. As can be seen, compared with the prior art, the sense amplifier according to the present invention has an improved response time, reducing the time delay up to 80%.

While the present invention has been described with respect to certain preferred embodiments only, other modifications and variation may be made without departing from the spirit and scope of the present invention as set forth in the following claims.

What is claimed is:

1. In a semiconductor memory device including a memory cell array with a plurality of memory cells and a sense amplifier which detects and amplifies a data signal from the memory cell array to output a full swing signal, the sense amplifier comprising:
   a bit line and a bit line bar coupled to the memory cell;
   a data line and an inverting data lines for transferring an output of the sense amplifier;
   a first P-type MOS/BIPOLAR composite transistor having a source/emitter coupled to a first level potential, a gate/base coupled to the inverting data line and a drain/collector coupled to the data line;
   a second P-type MOS/BIPOLAR composite transistor having a source/emitter coupled to the first level potential, a gate/base coupled to the data line and a drain/collector coupled to the inverting data line;
   a first N-type MOS/BIPOLAR composite transistor having a drain/collector coupled to the data line and a gate/base coupled to the inverting data line;
   a second N-type MOS/BIPOLAR composite transistor having a drain/collector coupled to the inverting data line and a gate/base coupled to the data line;
   a first select MOS/BIPOLAR composite transistor coupled between the bit line and the source/emitter of the first N-type MOS/BIPOLAR composite transistor. whose gate/base receives a sense enable signal;
   a second select MOS/BIPOLAR composite transistor coupled between the bit line bar and the source/emitter of the second N-type MOS/BIPOLAR composite transistor, whose gate/base receives the sense enable signal;
   a first load coupled between a source/emitter of the first N-type MOS/BIPOLAR composite transistor and a second level potential; and
   a second load coupled between a source/emitter of the second N-type MOS/BIPOLAR composite transistor and the second level potential,
   whereby the source/emitter of each of the first and second N-type MOS/BIPOLAR composite transistors arc coupled to the bit line and the bit line bar, respectively, when the sense amplifier is enabled.

2. The sense amplifier as recited in claim 1, wherein the first and second select MOS/BIPOLAR composite transistors are N-type MOS/BIPOLAR composite transistors.

3. The sense amplifier as recited in claim 1, wherein the first load is a third N-TYPE MOS/BIPOLAR composite transistor whose gate/base receives a low level signal, and wherein the second load is a fourth N-type MOS/BIPOLAR composite transistor whose gate/base receives a low level signal.

4. The sense amplifier as recited in claim 1, wherein each of the memory cells includes:
   a capacitor, wherein one terminal of the capacitor receives a plate voltage; and
   an N-type MOS/BIPOLAR composite transistor, wherein the N-type MOS/BIPOLAR composite transistor has a gate/base coupled to corresponding word line, a drain/collector coupled to corresponding bit line and a source/emitter coupled to the other terminal of the capacitor.

5. A semiconductor memory device including a memory cell array with a plurality of memory cells and a sense amplifier which detects and amplifies a data signal from the memory cell array to output a full swing signal, the sense amplifier comprising:
   a bit line and a bit line bar coupled to the memory cell;
   a data line and an inverting data lines for transferring an output of the sense amplifier;
   a first P-type MOS/BIPOLAR composite transistor having a source/emitter coupled to a first level potential, a gate/base coupled to the inverting data line and a drain/collector coupled to the data line;
   a second P-type MOS/BIPOLAR composite transistor having a source/emitter coupled to the first level potential, a gate/base coupled to the data line and a drain/collector coupled to the inverting data line;

a first N-type MOS/BIPOLAR composite transistor having a drain/collector coupled to the data line and a gate/base coupled to the inverting data line;

a second N-type MOS/BIPOLAR composite transistor having a drain/collector coupled to the inverting data line and a gate/base coupled to the data line;

a first select MOS/BIPOLAR composite transistor coupled between the bit line and the source/emitter of the first N-type MOS/BIPOLAR composite transistor whose gate/base receives a sense enable signal;

a second select MOS/BIPOLAR composite transistor coupled between the bit line bar and the source/emitter of the second N-type MOS/BIPOLAR composite transistor whose gate/base receives the sense enable signal;

a first load coupled between a source/emitter of the first N-type MOS/BIPOLAR composite transistor and a second level potential; and a second load coupled between a source/emitter of the second N-type MOS/BIPOLAR composite transistor and the second level potential.

6. The semiconductor memory device as recited in claim 5, wherein the first and second select MOS/BIPOLAR composite transistors are N-type MOS/BIPOLAR composite transistors.

7. The semiconductor memory device as recited in claim 5, wherein the first load is a third N-TYPE MOS/BIPOLAR composite transistor whose gate/base receives a low level signal, and wherein the second load is a fourth N-type MOS/BIPOLAR composite transistor whose gate/base receives a low level signal.

8. The semiconductor memory device as recited in claim 5, wherein each of the memory cells includes:

a capacitor, wherein one terminal of the capacitor receives a plate voltage; and an N-type MOS/BIPOLAR composite transistor type, wherein the N-type MOS/BIPOLAR composite transistor has a gate/base coupled to corresponding word line, a drain/collector coupled to corresponding bit line and a source/emitter coupled to the other terminal of the capacitor.

9. In a semiconductor memory device including a memory cell array with a plurality of memory cells and a sense amplifier which detects and amplifies a data signal from the memory cell array to output a full swing signal, the sense amplifier comprising:

a bit line and a bit line bar coupled to the memory cell;

a data line and an inverting data line to which input/output data are applied;

a first P-type MOS/BIPOLAR composite transistor having a source/emitter coupled to a first level potential, a gate/base coupled to a second output node and a drain/collector coupled to a first output node;

a second P-type MOS/BIPOLAR composite transistor having a source/emitter coupled to the first level potential, a gate/base coupled to the first output node and a drain/collector coupled to the second output node;

a first N-type MOS/BIPOLAR composite transistor having a drain/collector coupled to the first output node and a gate/base coupled to the second output node;

a second N-type MOS/BIPOLAR composite transistor having a drain/collector coupled to the second output node and a gate/base coupled to the first output node;

a first load coupled between a source/emitter of the first N-type MOS/BIPOLAR composite transistor and a second level potential;

a second load coupled between a source/emitter of the second N-type MOS/BIPOLAR composite transistor and the second level potential;

a first select transistor coupled between the bit line and a source/emitter of the first N-type MOS/BIPOLAR composite transistor, wherein the first select transistor is turned on in response to a sense enable signal;

a second select transistor coupled between the bit line bar and the source/emitter of the second N-type MOS/BIPOLAR composite transistor, wherein the second select transistor is turned on in response to the sense enable signal;

a first column-select transistor coupled between the first output node and the data line; and a second column-select transistor coupled between the second output node and the inverting data line.

10. The sense amplifier as recited in claim 9, wherein the first column-select transistor is an N-type MOS/BIPOLAR composite transistor whose gate/base receives a column-select signal, wherein the second column-select transistor is an N-type MOS/BIPOLAR composite transistor whose gate/base receives the column-select signal, wherein the first select transistor is an N-type MOS/BIPOLAR composite transistor whose gate/base receives the sense enable signal, and wherein the second select transistor is an N-type MOS/BIPOLAR composite transistor whose gate/base receives the sense enable signal.

11. The sense amplifier as recited in claim 9, further comprising:

a first precharge MOS/BIPOLAR composite transistor coupled between the first output node and the second output node; and a second precharge MOS/BIPOLAR composite transistor coupled between the bit line and the bit line bar.

12. The sense amplifier as recited in claim 11, wherein the first and second precharge MOS/BIPOLAR composite transistor are N-type MOS/BIPOLAR composite transistors.

13. The sense amplifier as recited in claim 9, further comprising:

a first isolating MOS/BIPOLAR composite transistor coupled between the first output node and the bit line; and a second isolating MOS/BIPOLAR composite transistor coupled between the second output node and the bit line bar.

14. The sense amplifier as recited in claim 9, wherein the first load is a third N-type MOS/BIPOLAR composite transistor whose gate/base receives a low level signal, and wherein the second load is a fourth N-type MOS/BIPOLAR composite transistor whose gate/base receives a low level signal.

15. The sense amplifier as recited in claim 9, wherein each of the memory cell includes:

a capacitor, wherein one terminal of the capacitor receives a plate voltage; and an N-type MOS/BIPOLAR composite transistor, wherein the N-type MOS/BIPOLAR composite transistor has a gate/base coupled to corresponding word line, a drain/collector coupled to corresponding bit line and a source/emitter coupled to the other terminal of the capacitor.

16. A semiconductor memory device including a memory cell array with a plurality of memory cells and a sense amplifier which detects and amplifies a data signal from the memory cell array to output a full swing signal, the sense amplifier comprising:

a bit line and a bit line bar coupled to the memory cell;

a data line and an inverting data line to which input/output data are applied;

a first P-type MOS/BIPOLAR composite transistor having a source/emitter coupled to a first level potential, a gate/base coupled to a second output node and a drain/collector coupled to a first output node;

a second P-type MOS/BIPOLAR composite transistor having a source/emitter coupled to the first level potential, a gate/base coupled to the first output node and a drain/collector coupled to the second output node;

a first N-type MOS/BIPOLAR composite transistor having a drain/collector coupled to the first output node and a gate/base coupled to the second output node;

a second N-type MOS/BIPOLAR composite transistor having a drain/collector coupled to the second output node and a gate/base coupled to the first output node;

a first load coupled between a source/emitter of the first N-type MOS/BIPOLAR composite transistor and a second level potential;

a second load coupled between a source/emitter of the second N-type MOS/BIPOLAR composite transistor and the second level potential;

a first select MOS/BIPOLAR composite transistor coupled between the bit line and a source/emitter of the first N-type MOS/BIPOLAR composite transistor, wherein the first select transistor is turned on in response to a sense enable signal;

a second select MOS/BIPOLAR composite transistor coupled between the bit line bar and the source/emitter of the second N-type MOS/BIPOLAR composite transistor, wherein the second select transistor is turned on in response to the sense enable signal;

a first column-select MOS/BIPOLAR composite transistor coupled between the first output node and the data line; and a second column-select transistor coupled between the second output node and the inverting data line.

17. The semiconductor memory device as recited in claim 16, wherein the first column-select MOS/BIPOLAR transistor is an N-type MOS/BIPOLAR composite transistor whose gate/base receives a column-select signal, wherein the second column-select MOS/BIPOLAR composite transistor is an N-type MOS/BIPOLAR composite transistor whose gate/base receiving the column-select signal, wherein the first select MOS/BIPOLAR composite transistor is an N-type MOS/BIPOLAR composite transistor whose gate/base receiving the sense enable signal, and wherein the second select MOS/BIPOLAR composite transistor is an N-type MOS/BIPOLAR composite transistor whose gate/base receiving the sense enable signal.

18. The sense amplifier as recited in claim 16, further comprising:

a first precharge MOS/BIPOLAR composite transistor coupled between the first output node and the second output node; and a second precharge MOS/BIPOLAR composite transistor coupled between the bit line and the bit line bar.

19. The sense amplifier as recited in claim 18, wherein the first and second precharge MOS/BIPOLAR composite transistor are N-type MOS/BIPOLAR composite transistor.

20. The semiconductor memory device as recited in claim 16, further comprising:

a first isolating MOS/BIPOLAR composite transistor coupled between the first output node and the bit line; and a second isolating MOS/BIPOLAR composite transistor coupled between the second output node and the bit line bar.

21. The semiconductor memory device as recited in claim 16, wherein the first load is a third N-type MOS/BIPOLAR composite transistor whose gate/base receives a low level signal, and wherein the second load is a fourth N-type MOS/BIPOLAR composite transistor whose gate/base receives a low level signal.

22. The semiconductor memory device as recited in claim 16, wherein each of the memory cells includes:

a capacitor, wherein one terminal of the capacitor receives a plate potential; and an N-type MOS/BIPOLAR composite transistor, wherein the N-type MOS/BIPOLAR composite transistor has a gate/base coupled to corresponding word line, a drain/collector coupled to corresponding bit line and a source/emitter coupled to the other terminal of the capacitor.

* * * * *